April 5, 1966 T. CSAKVARI 3,243,862

METHOD OF MAKING SEMICONDUCTOR DEVICES

Filed Oct. 24, 1961

WITNESSES:

Bernard R. Giegucz

Raymond F. Majeske

INVENTOR

Tibor Csakvari

BY

Frederick Shapoe

ATTORNEY 3,243,862

METHOD OF MAKING SEMICONDUCTOR DEVICES

Tibor Csakvari, Greensburg, Pa., assignor to Westinghouse Electric Corporation, East Pittsburgh, Pa., a corporation of Pennsylvania Filed Oct. 24, 1961, Ser. No. 147,233
1 Claim. (Cl. 29—25.3)

The present invention relates to a base assembly for semiconductor devices and a process for producing the same.

In the fabrication of certain semiconductor diode devices in which a semiconductor member is soldered to one surface of a support member, problems have heretofore arisen in joining an electrical conductor to the opposite surface of the support member or base member without damaging the semiconductor member from thermal and mechanical shock. Previously designed support or base members had flat parallel surfaces to which one surface was soldered a semiconductor member and to the other surface was welded an electrical lead. During the welding operation of the electrical lead to the surface of the support, the thermal and mechanical shock created thereby during the welding operation was so great in a vertical direction toward the semiconductor member that in many cases the semiconductor member became embrittled and cracked.

Various attempts have been made to solve this problem and it was initially proposed to solder a steel eyelet to one surface of the base member to relieve some of the stresses created during welding. Another proposal was to press a metal eyelet into a powder compact and sinter the resulting assembly to provide a unitary integral structure. This was the subject matter of U.S. application Serial No. 148,120, filed October 27, 1961. It has been shown experimentally that an eyelet is necessary to distribute or change the direction of thermal and mechanical shock during welding from the vertical direction to the horizontal direction.

The object of the present invention is to provide a base electrode comprising a flat base and an integral hollow conical projection for a semiconductor device wherein an electrical conductor lead can be welded to the hollow of the conical projection of the base electrode whereby the thermal and mechanical shock created during welding is not deleterious to a semiconductor wafer member soldered to the opposite surface of the base electrode.

Another object of the invention is to provide a process for producing a base assembly suitable for use in a semiconductor device by disposing a powdered metal in a forming die, compressing the same at a high pressure and sintering the resulting compact having one relatively flat surface and having a conical projecting portion on the other surface, the apertured projecting portion being capable of receiving an electrical conductor therein.

Other objects of the invention will, in part, be obvious and will, in part, appear hereinafter.

In order to more fully understand the nature and objects of the invention, reference should be had to the following detailed description and drawings, in which.

In accordance with the present invention and in attainment of the foregoing objects there is provided an electrode base member comprising a flat face and a hollow conical projection on the other face, and a process for producing the same. To produce the base member, an electrically conductive metal powder is disposed in a forming die and the powder is compressed at a high pressure. The compact is then sintered at an elevated temperature to produce a solid body. The resulting compact is disk-shaped with one relatively flat surface while from the other surface a hollow or apertured conical projection extends upwardly. Subsequently, an electrically conductive lead may be welded in the aperture of the projection. A high proportion of the thermal and mechanical shock created from the welding operation will be distributed in a horizontal direction and as a result does not have any significant deleterious effect on a semiconductor member previously soldered to the said one flat surface of the compact.

Figure 1:
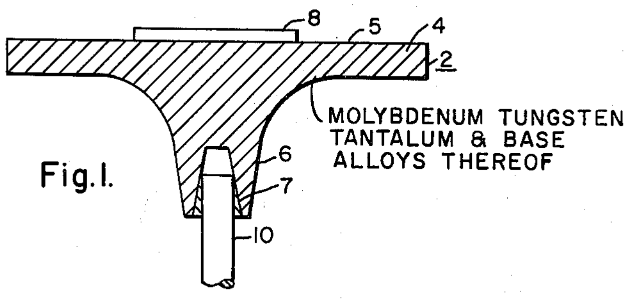
FIGURE 1 is an elevation view in cross-section of a base assembly produced by the process of the invention.

Referring to FIG. 1, there is shown a base electrode 2 suitable for use in producing semiconductor devices. The base electrode 2 is formed by feeding a powdered metal into a suitably shaped forming die and compressing the same with a punch member at a high pressure and either heating the powder during compression or subsequently sintering the compact to produce a solid body with good physical properties. The base assembly comprises a disk 4 with one flat surface 5 and a conical projection 6 containing an axial aperture 7 extending from the opposite surface. The aperture 7 may be of uniform diameter, but best results are obtained if it has a tapered wall opening which is wider at the open end than the wire lead to be soldered thereto.

In preparing semiconductor devices, a semiconductor wafer 8 is soldered by a soft or hard solder such as a silver brazing alloy to the flat surface 5 of the base electrode 2 and an electrical conductor lead 10 is welded in the aperture 7 of the projection 6.

Figure 3:
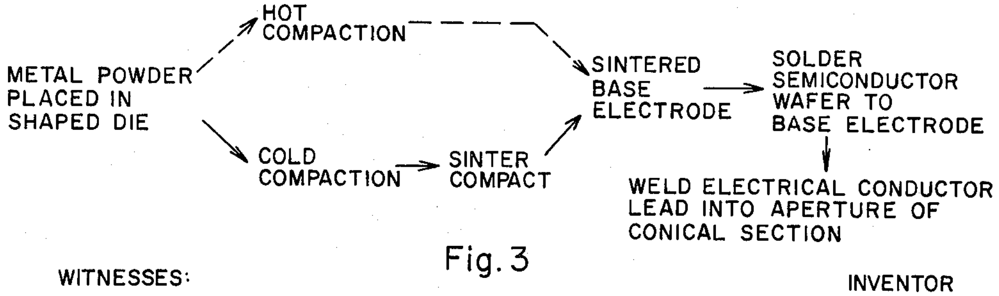
FIG. 3 is a flow sheet indicating successive operations for manufacturing a semiconductor device embodying the teachings of the invention.

Referring to FIG. 3, there is shown a flow sheet indicating the processes followed in making the semiconductor device of FIG. 1.

Figure 2:
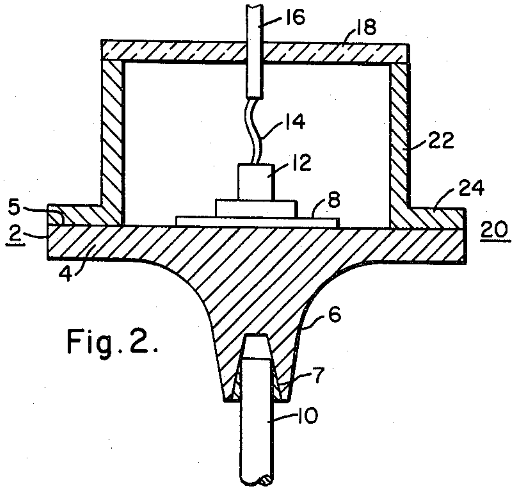
FIG. 2 is an elevation view in cross-section of a semiconductor device embodying the base assembly of the present invention.

Referring to FIG. 2, there is shown a complete semiconductor diode device 20 employing the base electrode 2 of FIG. 1. Subsequent to soldering the semiconductor wafer 8 and welding an electrically conductive lead 10 to the base electrode 2, a contact member 12 is soldered to the upper surface of the semiconductor wafer 8 and a flexible electrically conductive lead 14 is soldered at one end to the contact member 12 and at the other end it is soldered to an external electrical conductor 16 which passes through and is sealed to an insulating member 18. The member 18 is joined to a cylindrical shell 22 having a flange 24 joined to the flat surface 5 of the base electrode 2 thereby encapsulating the semiconductor member.

The following example is illustrative of the teachings of the invention wherein a semiconductor device was made in accordance with the process set forth hereinbefore.

The base electrode consisted of molybdenum having a disk of ⅜ inch diameter from which the integral conical projection extended .080 inch. The semiconductor wafer was silicon, while the electrically conductive leads, flexible lead and cylindrical shell were composed of a copper base alloy and the insulating member was composed of an aluminum silicate glass. A series of these devices, numbered 226 to 248 were prepared.

Similarly, a number of comparable semiconductor devices were made in which the base electrode was a molybdenum disk with parallel flat surfaces and the electrical lead attached to the base electrode was welded directly to the flat surface instead of employing an apertured conical projection. These devices were numbered 250 to 259.

Both types of devices were tested by impressing a voltage across them. The results of the test indicated that in the cases where an apertured projecting segment was not used and the lead wires welded directly to the flat surfaced base member, the semiconductor wafer was often cracked or damaged. This was indicated by an increase in the forward voltage of the diode after welding the electrical lead to the flat surface as is shown in Table I. The devices tested employing an apertured integral projection showed no appreciable increase in the forward voltage after welding the electrical lead in the aperture as indicated in Table II. Therefore, the apertured conical projection is effective to distribute more favorably the direction of thermal and mechanical shock from the vertical to the horizontal.

*Table I*

| No. | Before Welding Fwd. (v.) | After Welding Fwd. (v.) |
|---|---|---|
| 250 | 1.00 | 1.03 |
| 1 | .97 | 1.17 |
| 2 | .96 | 1.33 |
| 3 | .95 | 1.17 |
| 4 | 1.00 | 1.05 |
| 5 | 1.00 | 1.07 |
| 6 | .99 | 1.05 |
| 7 | .97 | 1.03 |
| 8 | .96 | 1.06 |
| 259 | .98 | 1.06 |

*Table II*

| No. | Before Welding Fwd. (v.) | After Welding Fwd. (v.) |
|---|---|---|
| 226 | .95 | .95 |
| 7 | .93 | .92 |
| 8 | .93 | .93 |
| 9 | .92 | .92 |
| 230 | .94 | .94 |
| 1 | .97 | .96 |
| 2 | .91 | .91 |
| 3 | .92 | .91 |
| 4 | .95 | .95 |
| 5 | .96 | .95 |
| 6 | .95 | .95 |
| 7 | .96 | .96 |
| 8 | .94 | .94 |
| 9 | .94 | .94 |
| 240 | .93 | .94 |
| 1 | .96 | .96 |
| 2 | .93 | |
| 3 | .98 | .99 |
| 4 | .91 | .91 |
| 5 | .92 | .90 |
| 6 | .94 | .94 |
| 7 | .93 | .93 |
| 8 | .92 | .92 |

It should be understood that the powdered material chosen is selected on a basis of its expansion characteristics as compared to the semiconductor used. In this particular case molybdenum was used since its expansion characteristics very closely match that of silicon. It should be appreciated that other powdered metals such as tantalum and tungsten and their base alloys and mixtures of two or more may be utilized.

While the projection 6 is illustrated as a cone having a curved surface, it will be appreciated that projections of slightly differing shapes may be employed. Thus, straight sided conical projections, stepped conical projections and even cylindrical projections with a large radius fairing into the surface of the disk 4 may be employed.

It is intended that the above description and drawing be interpreted as illustrative and not limiting.

I claim as my invention:

In the process for producing a semiconductor rectifier device, the steps comprising the sequence of (1) disposing only a metal powder consisting of at least one metal selected from the group consisting of molybdenum, tungsten, tantalum and base alloys thereof in a forming die, (2) compressing said metal powder at a high pressure to produce a compact having one relatively flat surface and having an apertured conical projecting portion on the other surface, (3) sintering said compact to provide a solid body, (4) affixing a single crystal semiconductor wafer member to said relatively flat surface of said solid body, (5) thereafter disposing an electrical lead within said apertured conical projecting portion of said solid body and (6) welding said electrical lead to said apertured conical projecting portion.

References Cited by the Examiner

UNITED STATES PATENTS

| | | | |
|---|---|---|---|
| 2,462,906 | 3/1949 | Sauerborn | 317—241 |
| 2,763,822 | 9/1956 | Frola et al. | 317—235 |
| 2,801,375 | 7/1957 | Losco | 317—234 |
| 3,036,250 | 5/1962 | Bender | 317—234 |

ROBERT K. SCHAEFER, *Primary Examiner.*

JAMES D. KALLAM, DARRELL L. CLAY, LARAMIE E. ASKIN, *Examiners.*

L. ZALMAN, *Assistant Examiner.*